United States Patent
Guo et al.

(10) Patent No.: US 10,371,835 B2
(45) Date of Patent: Aug. 6, 2019

(54) MICROCELL INTERCONNECTION IN SILICON PHOTOMULTIPLIERS

(71) Applicant: General Electric Company, Schenectady, NY (US)

(72) Inventors: Jianjun Guo, Ballston Spa, NY (US); Adrian Ivan, Niskayuna, NY (US); Sergei Ivanovich Dolinsky, Clifton Park, NY (US); Geng Fu, Rexford, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 14/992,635

(22) Filed: Jan. 11, 2016

(65) Prior Publication Data

US 2017/0199287 A1   Jul. 13, 2017

(51) Int. Cl.
   *G01T 1/24* (2006.01)
   *H01L 27/146* (2006.01)
   *G01T 1/208* (2006.01)

(52) U.S. Cl.
   CPC ............ *G01T 1/248* (2013.01); *G01T 1/208* (2013.01); *G01T 1/247* (2013.01); *H01L 27/14658* (2013.01)

(58) Field of Classification Search
   CPC .................................. G01T 1/208; G01J 11/00
   See application file for complete search history.

(56) References Cited

U.S. PATENT DOCUMENTS

| | | |
|---|---|---|
| 5,977,847 A | 11/1999 | Takahashi |
| 8,716,647 B2 | 5/2014 | O'Mathuna et al. |
| 8,937,285 B2 | 1/2015 | Kim et al. |
| 9,405,023 B2 | 8/2016 | Guo et al. |
| 9,541,448 B2 | 1/2017 | Guo et al. |
| 9,720,109 B2 | 8/2017 | Guo et al. |
| 9,851,455 B2 | 12/2017 | Dolinsky et al. |
| 9,854,231 B2 | 12/2017 | Guo et al. |
| 9,869,781 B2 | 1/2018 | Dolinsky et al. |
| 2010/0108900 A1* | 5/2010 | Burr ................ H01L 27/14609 250/370.11 |
| 2011/0108702 A1* | 5/2011 | Jackson ............ H01L 27/1446 250/207 |
| 2012/0068050 A1 | 3/2012 | Mazzillo et al. |
| 2012/0108960 A1 | 5/2012 | Halmann et al. |
| 2012/0228484 A1 | 9/2012 | Burr |
| 2014/0175294 A1 | 6/2014 | Frisch |

(Continued)

OTHER PUBLICATIONS

"Slot line—An Alternative Transmission Medium for Integrated Circuits", p. 104-109, Microwave Symposium, 1968 G-MTT International (1968), to Cohn, available at http://ieeexplore.ieee.org/stamp/stamp.jsp?arnumber=1123418.*

(Continued)

*Primary Examiner* — Kenneth J Malkowski

(57) ABSTRACT

A silicon photomultiplier array including a plurality of microcells arranged in rows and columns. A plurality of circuit traces connecting microcell output ports to the array pixel output port, with one or more impedance matching networks connected to at least one of the circuit traces. The impedance matching networks can be connected between each row circuit trace and the pixel output port. Impedance matching networks can be located between junctions of adjacent microcell output ports and row circuit traces.

4 Claims, 8 Drawing Sheets

(56) References Cited

U.S. PATENT DOCUMENTS

| | | | |
|---|---|---|---|
| 2014/0183339 A1* | 7/2014 | Dolinsky | G01T 1/2018 250/208.2 |
| 2014/0183369 A1 | 7/2014 | Frach et al. | |
| 2015/0001403 A1 | 1/2015 | Kim et al. | |
| 2015/0270430 A1 | 9/2015 | Harmon | |
| 2016/0356899 A1 | 12/2016 | Dolinsky et al. | |
| 2016/0371419 A1 | 12/2016 | Dolinsky et al. | |

OTHER PUBLICATIONS

"The Yin and Yang of Matching: Part 1—Basic Matching Concepts, 2005 High Frequency Electronics", pp. 16-24, to Rhea (hereinafter "Rhea").*

"Design and Characterization of CMOS High-Resolution Time-to-Digital Converters" to Mota (2000), p. 1-210).*

Ciciriello et al., "Designing the front-end electronics of a SiPM based y-ray detection system for optimal time resolution", Nuclear Science Symposium and Medical Imaging Conference (NSS/MIC), 2012 IEEE, pp. 827-833, 2012.

Berg et al., "Single-photon sampling architecture for solid-state imaging sensors", Proc Natl Acad Sci U S A, vol. 110, Issue 30, E2752-E2761, Jul. 23, 2013.

"Philips digital silicon photomultiplier technology", http://www.research.philips.com/initiatives/digitalphotoncounting/news/backgrounders/091015-philips-digital-silicon-photomultiplier-technology.html, Philips.

* cited by examiner

MICROCELL INTERCONNECTION IN SILICON PHOTOMULTIPLIERS

BACKGROUND

Radiation detection approaches exist that employ photosensors incorporating a microcell (e.g., a single photon avalanche diodes (SPAD)) operating in Geiger mode. Certain of these approaches have been implemented in large area devices, such as may be used in nuclear detectors. A readout pixel can be made up of an array of microcells, where each individual microcell can be connected to a readout network via a quenching resistor exhibiting resistance between 100 kΩ to 1 MΩ, known as solid state photomultiplier (SSPM), silicon photomultipliers (SiPM), multi-pixel photon counting (MPPC). When a bias voltage applied to the silicon photomultiplier (SiPM) is above breakdown, a detected photon generates an avalanche, the APD capacitance discharges to a breakdown voltage and the recharging current creates a signal.

Typically, the pulse shape associated with a single photo electron (SPE) signal has a fast rise time, followed by a long fall time. When detecting fast light pulse (e.g., on the order of tens of nanoseconds) such signals are aggregated across the numerous microcells forming a pixel of a SiPM device. The resulting pulse shape of the summed signal has a slow rise time (e.g., in the tens of nanoseconds) due to the convolution of single microcell responses with detected light pulse. Therefore, it is difficult to achieve good timing resolution with these devices due to the slow rise time of the aggregated signal for a given light pulse.

Analog SiPMs can have pixel outputs bonded-out by wires attached to the wafer, or by using short vertical interconnects implemented in Through-Silicon-Via (TSV) technology. Microcells can be connected by traces, and typically one or a few pads per array of microcells (pixel) can be used as output (wire bonds or TSV). An analog SiPM typically requires a front-end electronics to buffer (and/or amplify) the signal from the SiPM for further processing. Digital SiPM (dSiPM) technology has front-end electronics built-in to each of microcells to produce a digital output pulse. The microcells of a dSiPM communicate with an external controller having typically high clock speeds.

Due to the difference in actual position of microcells in an array, there can be a significant variation of transit time of pulse propagation across pixels. This variation degrades pulse characteristics. Attempting to equalize trace length by extending certain traces can significantly increase parasitics, and further degrade signal pulse shape due to the limited driving capability of the microcell.

DESCRIPTION

In accordance with embodiments, pulse shape characteristic variations of output pulse signals from microcells within SiPM, dSiPM, and Hybrid SiPM arrays caused by transmission line reflections of the circuit trace discontinuities and/or impedance mismatches within the photomultiplier array are reduced and/or eliminated. In accordance with embodiments, transmission line (e.g., slot line, microstrip, stripline, etc.) circuit traces with proper matching network(s) are fabricated in the photomultiplier array to interconnect the microcells to preserve the timing information.

These transmission line circuit traces and matching network(s) reduce the reflection due to routing, discontinuities, and impedance mismatching to result in improved pulse shape. The transmission lines can be fabricated to transmit fast analog and/or digital signals in SiPM devices. Proper matching and termination eliminates the reflection, improves the pulse shape in analog SiPM; thus, leading to better timing resolution of the photon event.

Figure 1:
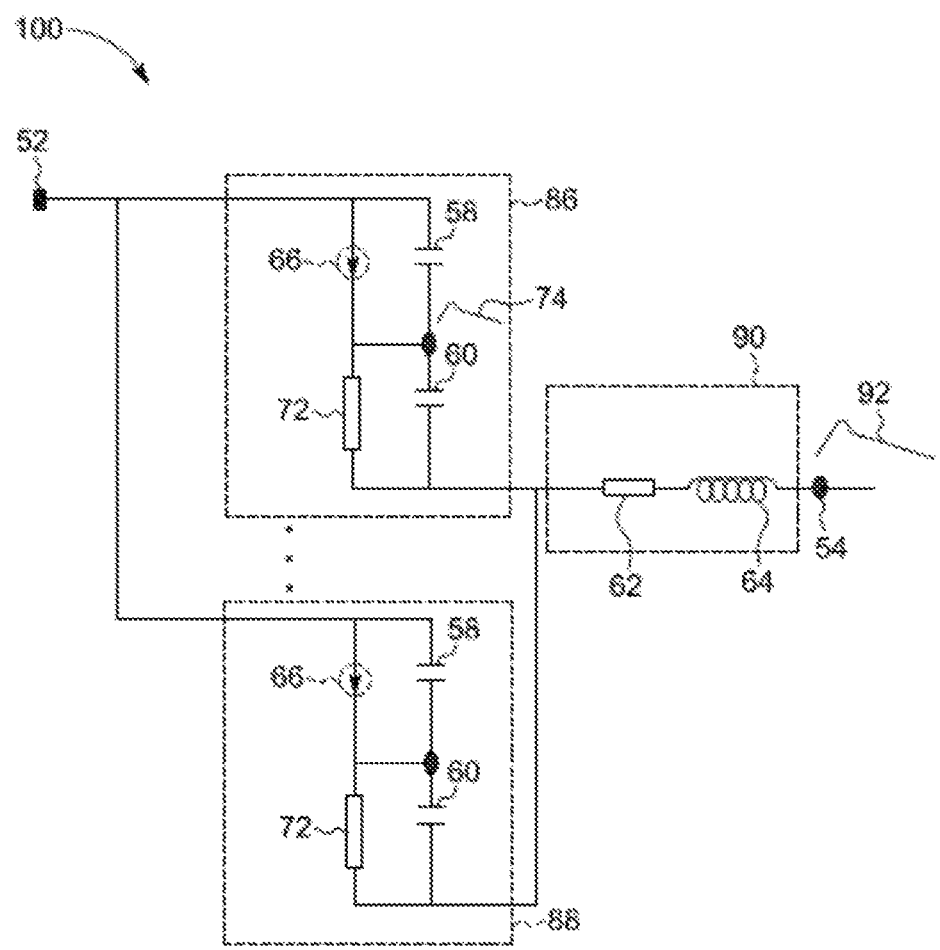
FIG. 1 depicts a conventional silicon photomultiplier pixel and threshold detector circuitry.

FIG. 1 depicts circuit 100 including a conventional silicon photomultiplier pixel and threshold detector circuitry, where a microcell is one of a plurality of microcells 88, 86 within an SiPM array of such cells. In one example, the depicted microcell may be part of an array of single photon avalanche diodes (SPAD) operated in Geiger mode within an analog SiPM. In the depicted example, the model has an associated cathode 52 and anode 54. The microcell portion of the model includes a diode capacitor 58 and a current pulse 66, such as may be associated with a photodiode. Quench circuitry in the depicted example includes quench resistor 72 and parasitic quench capacitor 60. Downstream of the quench circuitry, in this example, circuit trace impedances are modeled as parasitic resistor 62 and parasitic inductor 64.

In this model each individual APD of a pixel, such as the depicted microcell, is connected to a readout network via the quenching circuitry, including the quenching resistor (Rq) 72 with typical values between about 100 kΩ to about 1 MΩ. When a detected photon generates an avalanche event, a current pulse 66 is generated and the microcell diode capacitance Cd 58 discharges down to the breakdown voltage and the recharging current creates a measurable output signal. The typical pulse shape 92 at anode 54 of a single photo electron (SPE) signal has fast rise time (i.e., a sharp rising edge) followed by a long fall time (i.e., a slow falling tail).

Figure 2:
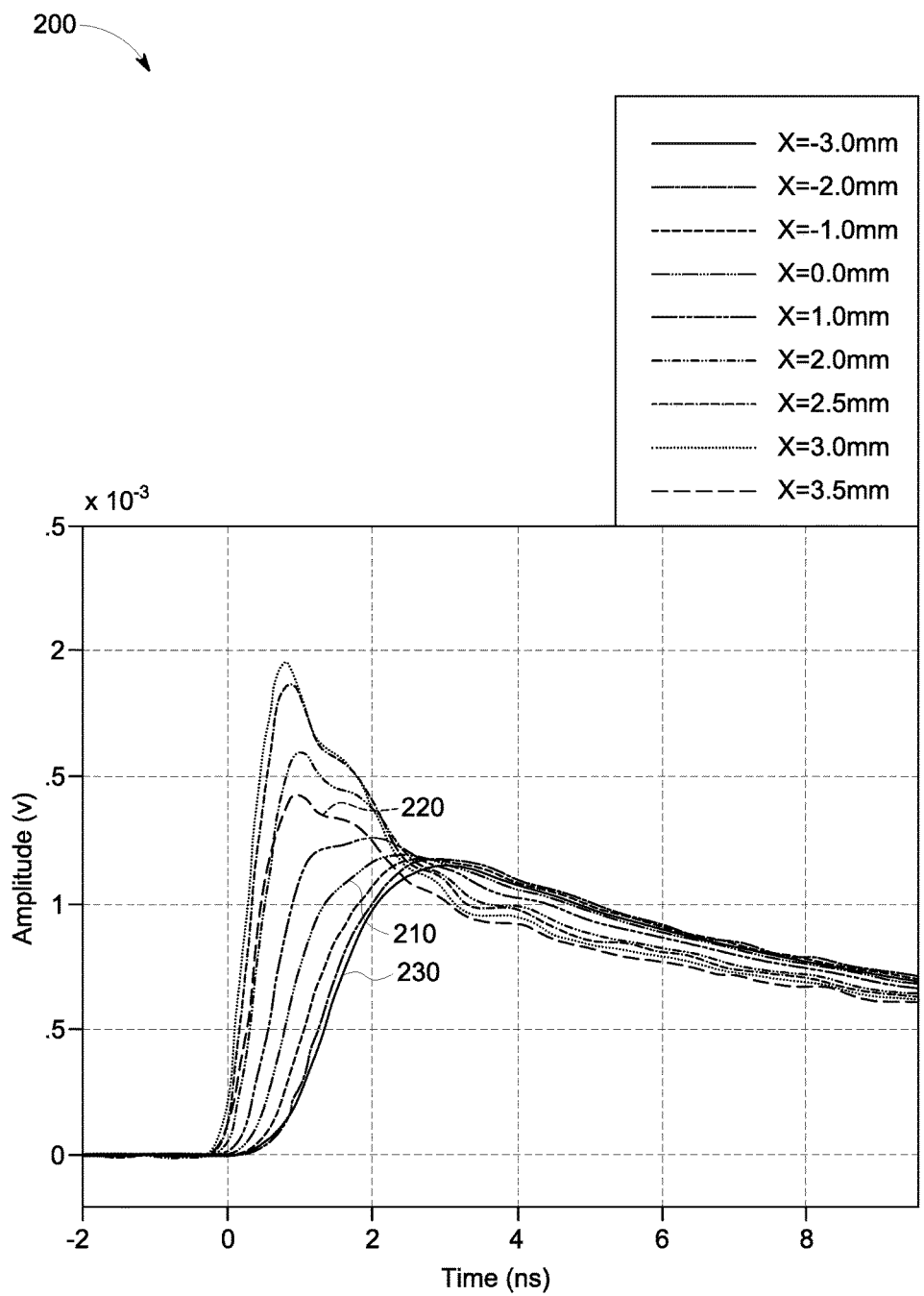
FIG. 2 depicts pixel output pulse shapes for different microcells of a SiPM device pixel in accordance with embodiments.

FIG. 2 depicts pulse shape 200 for selected microcells of a SiPM device pixel. The SiPM pixel can include a plurality of microcells arranged as a matrix, where some of the microcells are closer to the pixel's output port, and others are further from the output port. This positional difference causes a distortion and/or degradation in the pulse shape present at the output for different constituent microcells of the array. This distortion/degradation is caused by discontinuities and/or impedance mismatches in the trace path for the signals. The discontinuities and/or impedance mismatches can be a result of junctions in the circuit traces where the output ports of each microcell connects to the circuit trace. Other causes can be variation in the transmission line impedances and mismatches between the circuit trace impedance and the pixel output port, and/or the device that the output port connects with.

For example, pulse shape 220 is provided by a microcell that is 3.5 mm closer to the pixel's output port than the microcell that provides pulse shape 210. Conversely, pulse shape 230 is provided by microcell that is 3.0 mm further from the output port than the microcell that provides pulse shape 210. The various geometrical positions of the microcells in the SiPM pixel array provide various trace path lengths traveled by each pulse between its microcell and the array output. As the array becomes larger (e.g., about 4×4 mm, or larger), the pulse shape distortion becomes worse due to reflections caused by impedance mismatch, which leads to a degradation in timing resolution between the photon events being detected.

Figure 3:
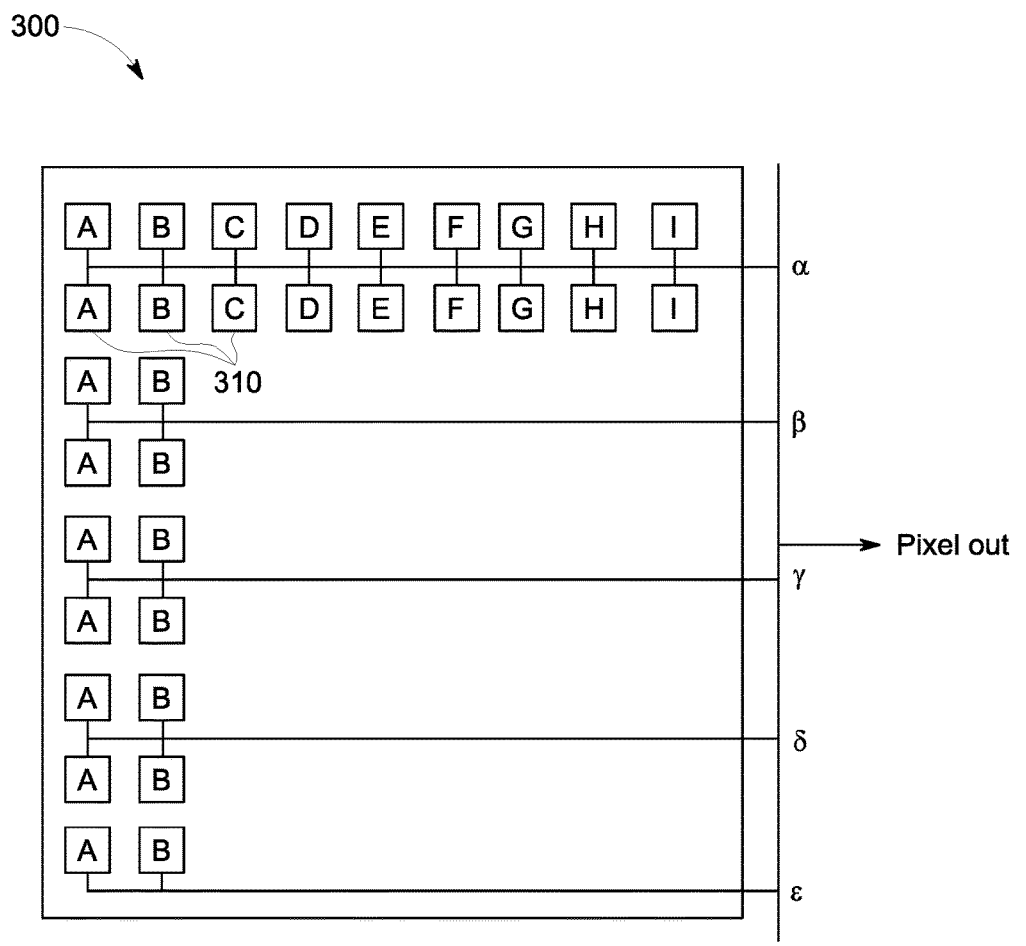
FIG. 3 depicts a configuration for an array of microcells in accordance with embodiments.

FIG. 3 depicts a configuration for a microcell array in a SiPM pixel 300 in accordance with embodiments. Microcells 310 are arranged in columns A, B, C, . . . , where adjacent rows of microcells are summed to readout lines α, β, γ, . . . . The readout lines provide the pixel output from the SiPM array. The geometry and position of the microcell locations within array 300 introduce different trace path lengths (with commensurate discontinuities and/or impedance mismatches) to the signals from each of the microcells. Readout lines α, β, γ, . . . are connected to a summer (not shown). The path length from the respective outputs of readout lines α, β, γ, . . . to the summer input introduce another level of path length which could differ for each readout line.

Figure 4:
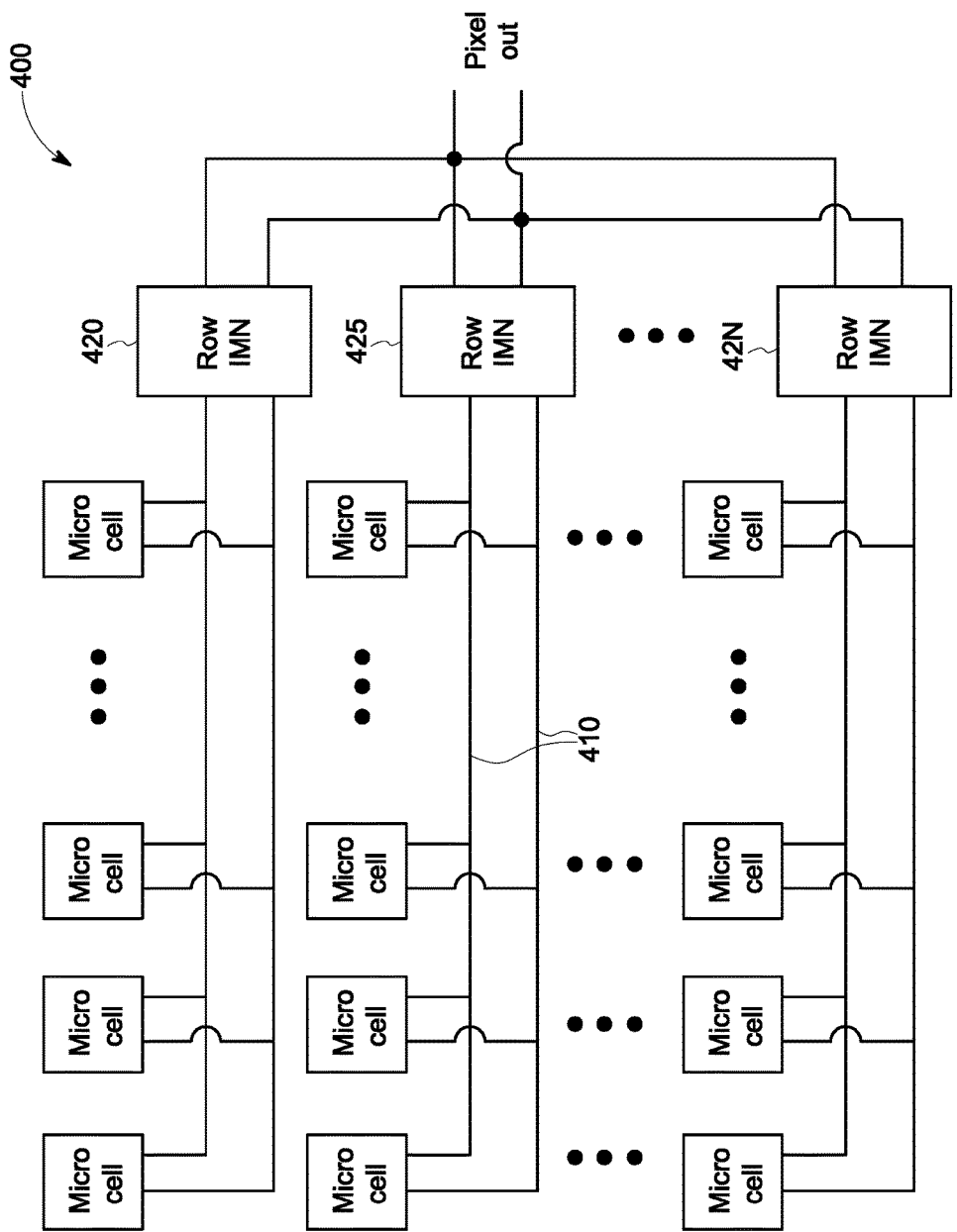
FIG. 4 depicts an array of microcells that includes an impedance matching network for each row in accordance with embodiments.

By way of example, if microcell A, microcell E, and microcell I each simultaneously sensed the same photon event and generated their respective avalanche signals at the same moment, the microcell output signals would each travel a different path length due to the physical phenomenon of the trace lengths associated with their respective microcell geometries and positions. Further, output signal propagation is also impacted by the different load impedances seen by the microcells FIG. 4 depicts SiPM microcell array 400 that includes M×N microcells arranged in rows and columns. In accordance with embodiments, circuit traces 410 connecting the microcells to the pixel output can be transmission lines (e.g., slot line, microstrip, stripline, etc.). Microcell array 400 can include one impedance matching network (IMN) 420, 425, 42N for each row of microcells in accordance with embodiments. The IMN can be implemented as a single, or double, stub (e.g., open-circuited, short-circuited, and/or resonant), lumped-element, stepped transmission line, etc.

Figure 5:
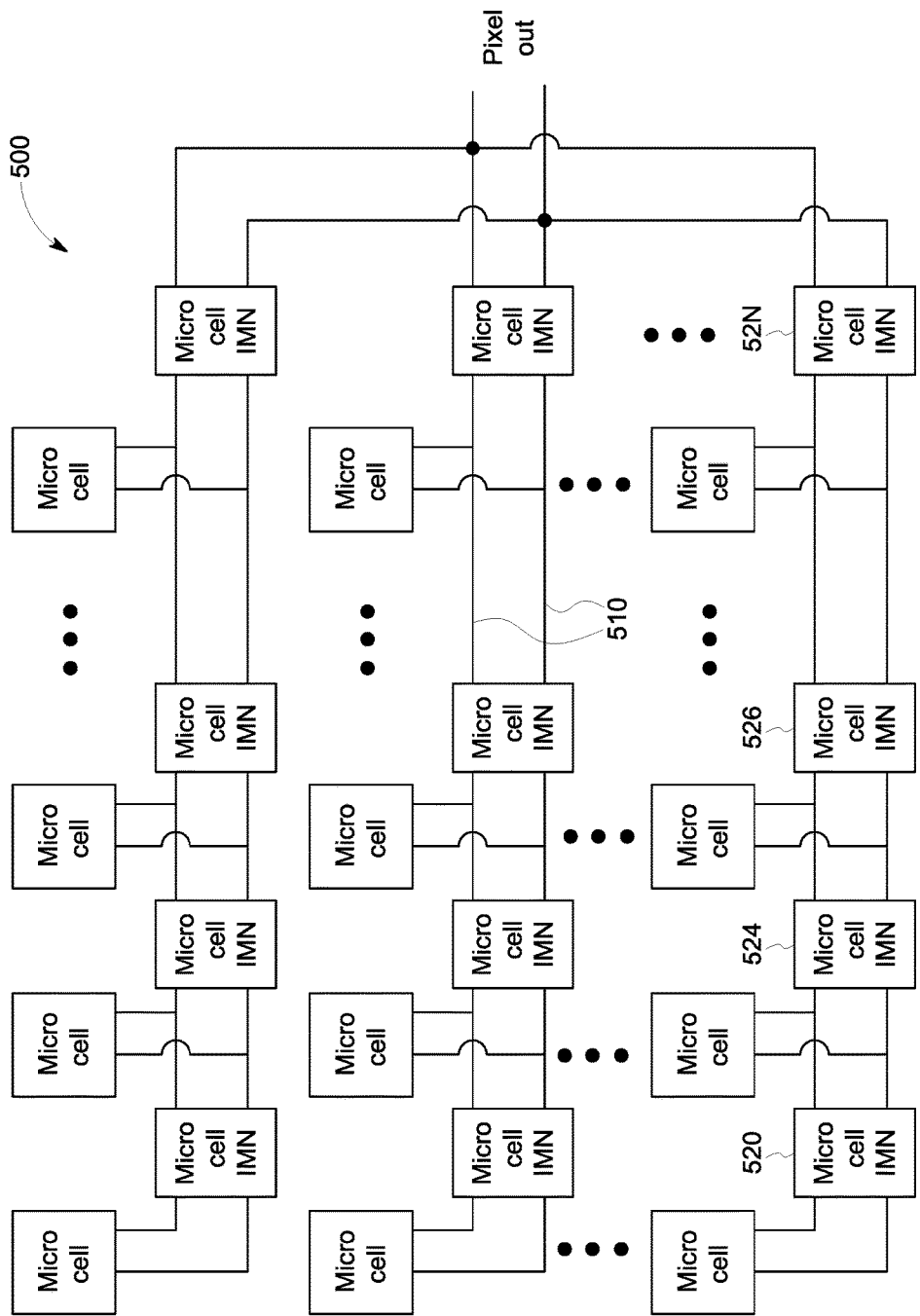
FIG. 5 depicts an array of microcells that includes an impedance matching network for each microcell in accordance with embodiments.

FIG. 5 depicts SiPM microcell array 500 that includes M×N microcells arranged in rows and columns. In accordance with embodiments, circuit traces 510 connecting the microcells to the pixel output can be transmission lines (e.g., slot line, microstrip, stripline, etc.). Microcell array 500 can include one IMN 520, 524, 526, 52N for each microcell in the array in accordance with embodiments. The IMN can be implemented as a single, or double, stub (e.g., open-circuited, short-circuited, and/or resonant), lumped-element, stepped transmission line, etc.

Figure 6:
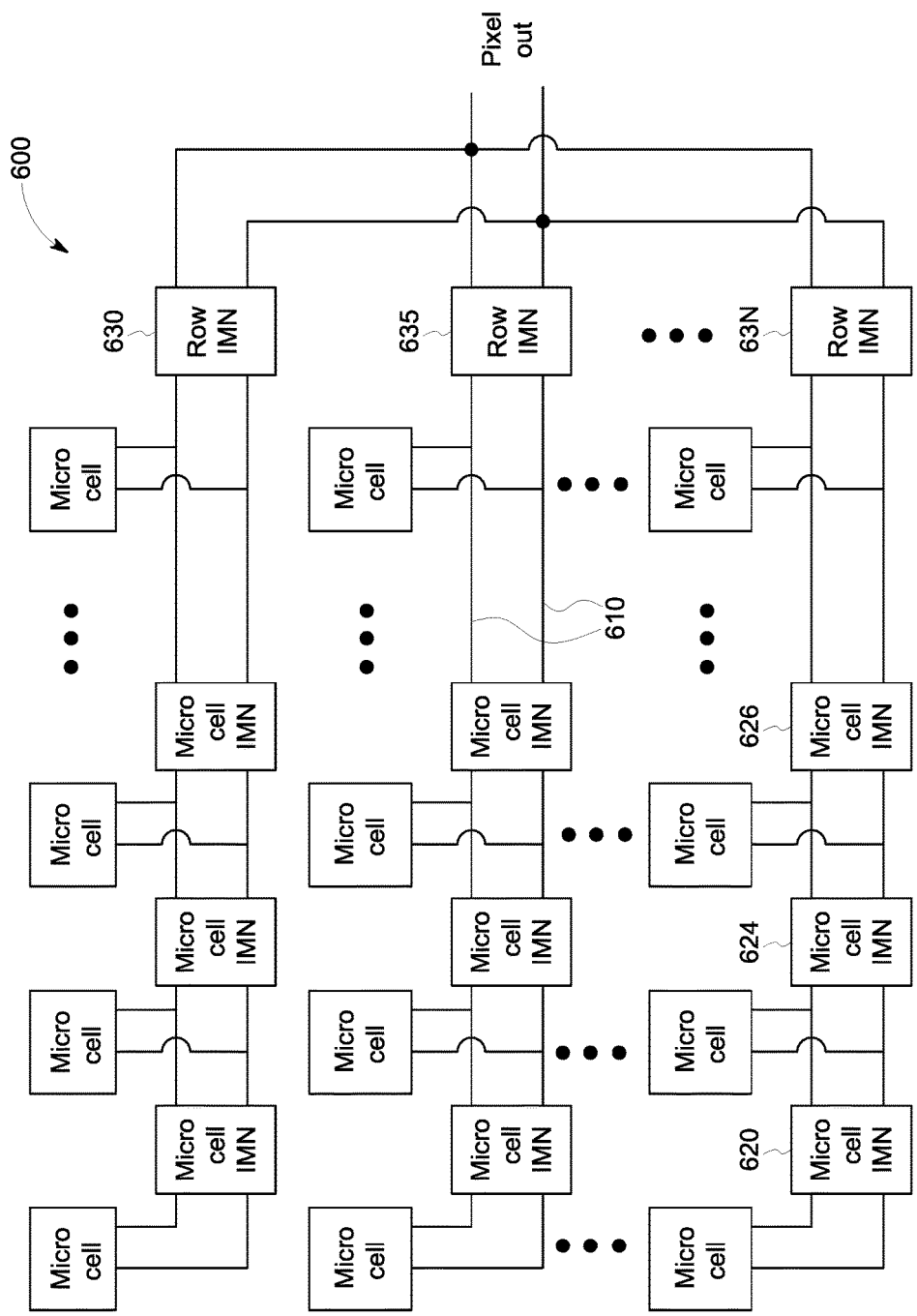
FIG. 6 depicts an array of microcells that includes an impedance matching network for each microcell and each row in accordance with embodiments.

FIG. 6 depicts SiPM microcell array 600 that includes M×N microcells arranged in rows and columns. In accordance with embodiments, circuit traces 610 connecting the microcells to the pixel output can be transmission lines (e.g., slot line, microstrip, stripline, etc.). Microcell array 600 can include one IMN 620, 624, 626, 62N for each microcell in the array. Additionally, in accordance with embodiments, microcell array 600 can include one IMN 630, 635, 63N for each row of microcells. The IMN can be implemented as a single, or double, stub (e.g., open-circuited, short-circuited, and/or resonant), lumped-element, stepped transmission line, etc.

IMN 620, 624, 626, 62N located at the juncture of each microcell with circuit traces 610 is of a different impedance match than IMN 630, 635, 63N located at the end of each row of microcells. The impedance matching network for the row microcells of the last column can be an independent matching network, or in some implementations can be included in the row impedance matching network.

Figure 7:
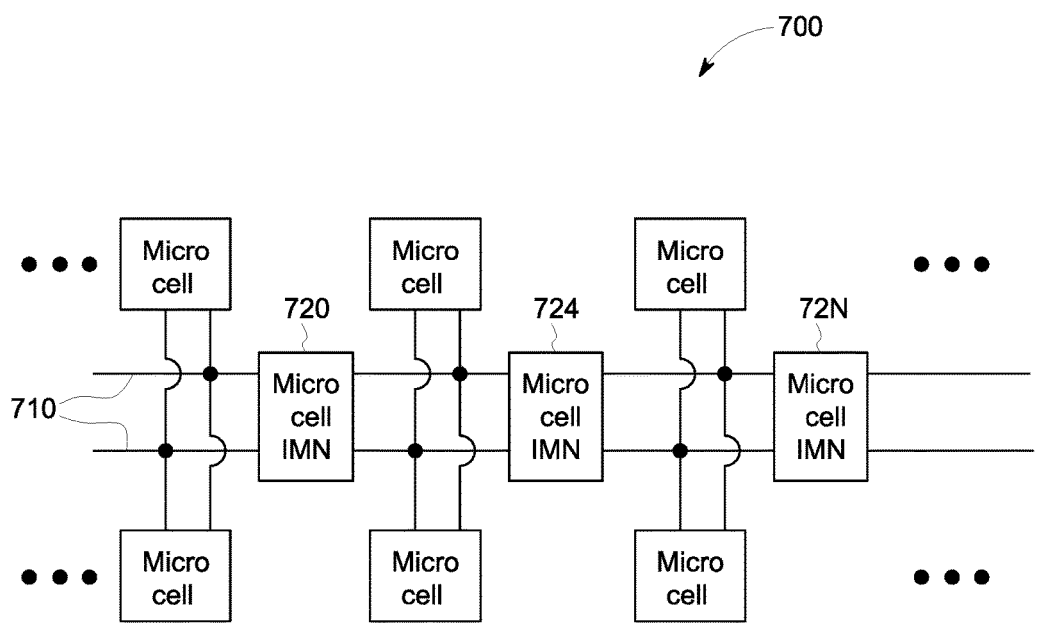
FIG. 7 depicts a partial array of microcells that includes an impedance matching network for pairs of microcell sharing a common transmission line in accordance with embodiments.

FIG. 7 depicts a portion of SiPM microcell array 700 that includes M×N microcells arranged in rows and columns. In accordance with embodiments, circuit traces 710 connecting the microcells to the pixel output can be transmission lines (e.g., slot line, microstrip, stripline, etc.). In accordance with embodiments, microcell array 700 has adjacent rows of microcells connected to common circuit traces. Microcell array 700 can include one IMN 720, 724, 72N for each pair of microcells connected to the common transmission line in accordance with embodiments. The IMN can be implemented as a single, or double, stub (e.g., open-circuited, short-circuited, and/or resonant), lumped-element, stepped transmission line, etc.

Figure 8:
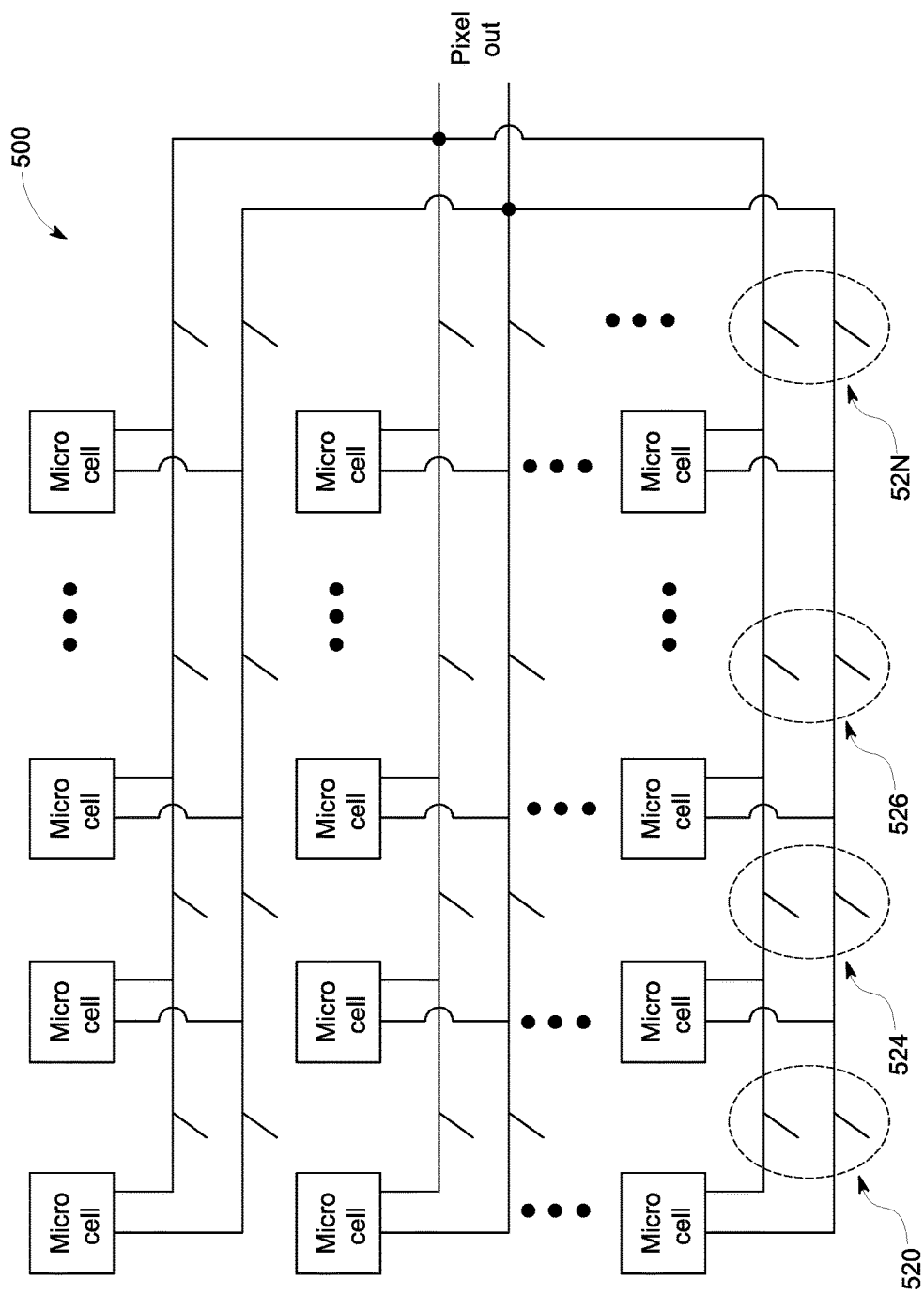
FIG. 8 depicts the microcell array of FIG. 5 with open-circuited stub impedance networks in accordance with embodiments.

FIG. 8 depicts microcell array 500 (FIG. 5) with open-circuited stub IMN 520, 524, 526, 52N in accordance with embodiments. In this implementation the impedance matching networks are depicted as open-circuited stubs.

Although specific hardware and methods have been described herein, note that any number of other configurations may be provided in accordance with embodiments of the invention. Thus, while there have been shown, described, and pointed out fundamental novel features of the invention, it will be understood that various omissions, substitutions, and changes in the form and details of the illustrated embodiments, and in their operation, may be made by those skilled in the art without departing from the spirit and scope of the invention. Substitutions of elements from one embodiment to another are also fully intended and contemplated. The invention is defined solely with regard to the claims appended hereto, and equivalents of the recitations therein.

The invention claimed is:

1. A silicon photomultiplier array comprising:
  a plurality of microcells within the photomultiplier array, the plurality of microcells arranged in rows and columns;
  each of the plurality of microcells including an output port, and configured to provide a pulse waveform having pulse characteristics;
  a plurality of circuit traces connecting the output port of the plurality of microcells to a pixel output port of the silicon photomultiplier array; and
  an impedance matching circuit for each row of microcells, the impedance matching circuit connected to at least one of the circuit traces and located between a junction of each microcell output port of a last column and the pixel output port of the silicon photomultiplier array, wherein the impedance matching circuit is one of a single stub, a double stub, a lumped-element, and a stepped transmission line.

2. The silicon photomultiplier array of claim 1, including the circuit traces constructed as transmission lines.

3. The silicon photomultiplier array of claim 2, the transmission lines being one of a slot line, a microstrip, and a stripline.

4. The silicon photomultiplier array of claim 1, including one impedance matching circuit connected between each circuit trace of each row and the pixel output port.

* * * * *